United States Patent [19]

Shearer et al.

[11] Patent Number: 5,126,692
[45] Date of Patent: Jun. 30, 1992

[54] VARIABLE FREQUENCY SYSTEM HAVING LINEAR COMBINATION OF CHARGE PUMP AND VOLTAGE CONTROLLED OSCILLATOR

[75] Inventors: Gerald Shearer, Orange; Karl M. Lofgren, Long Beach; Kenneth W. Ouyang, Huntington Beach, all of Calif.

[73] Assignee: Western Digital Corporation, Irvine, Calif.

[21] Appl. No.: 384,279

[22] Filed: Jul. 21, 1989

Related U.S. Application Data

[62] Division of Ser. No. 80,957, Aug. 3, 1987, Pat. No. 4,871,979.

[51] Int. Cl.$^5$ .............................................. H03L 7/00
[52] U.S. Cl. ........................................ 331/8; 331/17; 331/25
[58] Field of Search ..................... 331/1 A, 8, 17, 18, 331/25

[56] References Cited

U.S. PATENT DOCUMENTS 4,649,353  3/1987  Sonnenberg ............................ 331/8
4,774,480  7/1988  Sato et al. ........................ 331/17 X

Primary Examiner—Robert J. Pascal
Attorney, Agent, or Firm—Spensley Horn Jubas & Lubitz

[57] ABSTRACT

A phase locked loop system having a non-linear voltage controlled oscillator (VCO) is provided with a variable gain charge pump. The charge pump supplies a pump current to an integrating network which transforms the pump current into a frequency-modulating input voltage. The frequency-modulating input voltage is applied to an input of the VCO. The frequency-modulating input voltage is also coupled to a gain control input of the variable gain charge pump so that the magnitude of the pump current will be a function of the absolute value of the frequency-modulating voltage.

A substantially constant loop gain may be obtained in the phase locked loop system by arranging the gain function of the variable gain charge pump in counterposed relation to the slope of a VCO transfer function defining the nonlinear relation between the frequency-modulating input voltage of the VCO and the output frequency of the VCO.

3 Claims, 7 Drawing Sheets

VARIABLE FREQUENCY SYSTEM HAVING LINEAR COMBINATION OF CHARGE PUMP AND VOLTAGE CONTROLLED OSCILLATOR

This is a division of application Ser. No. 07/080,957, filed on Aug. 3, 1987 now U.S. Pat. No. 4,871,979.

BACKGROUND OF THE INVENTION

1. Field of the Invention

The present invention is generally directed to servo systems that include a variable frequency oscillator which can be characterized as being non-linear. More specifically it is directed to phase locked loops which have a non-linear voltage controlled oscillator provided in combination with a charge accumulator and a charge pump.

2. Description of the Prior Art

Figure 1:
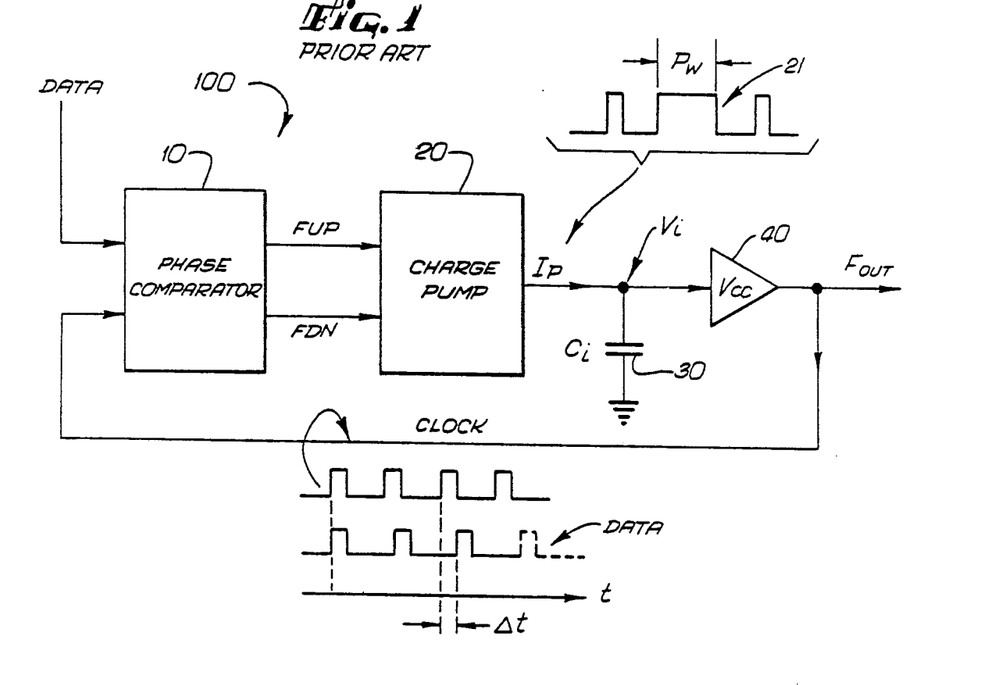
FIG. 1 is a block diagram of a known PLL system.

A known phase locked loop (PLL) system 100 is illustrated in FIG. 1. The PLL system 100 includes a phase comparator (detector) 10 which receives a self-clocking DATA signal from an asynchronous data source such as a disk drive for example. The comparator 10 supplies a frequency incrementing control signal FUP and a frequency decrementing control signal FDN to a charge pump 20. The charge pump 20 generates a pump current $I_p$ which flows in either a positive or negative direction depending on whether one or the other of the respective frequency incrementing/decrementing signals, FUP and FDN, is supplied. The pump current $I_p$ is generated as one or more fixed magnitude pulses 21 each having a pulse width $P_w$ equal to the time of application of either the FUP or FDN signals. Depending on which of the FUP and FDN signals is applied, the $I_p$ current pulses will either add charge into or withdraw charge out from a charge accumulating capacitor 30. The capacitor 30 has a predetermined capacitance $C_i$. Charge accumulation in the capacitor 30 generates an integrated voltage $V_i = \Sigma I_p P_w / C_i$ which is applied to the input of a voltage controlled oscillator (VCO) 40. The VCO 40 produces a periodic CLOCK signal having a variable frequency $F_{out}$ which is a function of the input voltage $V_i$. The CLOCK signal is fed back to one input of the phase comparator 10 while the DATA signal, which is generally aperiodic and is therefore of unknown phase and frequency, is supplied to another input of the phase comparator 10.

Although the DATA signal is generally aperiodic, it is self-clocking in the sense that it has a fundamental clocking frequency which can be derived by averaging over time. The PLL system 100 is designed to derive this fundamental clocking frequency and to lock on to the phase of the incoming DATA signal as well. The operation of the PLL system will be explained for the case where the CLOCK signal lags behind the DATA signal and then for the case where the CLOCK signal leads the DATA signal.

In situations where incoming edges of the DATA signal arrive before corresponding edges of the CLOCK signal (the CLOCK signal lags), the phase comparator 10 outputs the frequency incrementing signal FUP to the charge pump 20 and thereby causes the charge pump to inject the pump current $I_p$ into the integrating capacitor 30 so as to accumulate charge therein. The input voltage $V_i$ of the VCO 40 is incremented by the accumulated charge and in response, the VCO increases the speed of the CLOCK signal. The CLOCK frequency $F_{out}$ is incremented to a value greater than the fundamental clocking frequency of the DATA signal. The edges of the faster CLOCK signal then begin to catch up with the edges of the slower DATA signal. The output frequency $F_{out}$ drops back to the value of the fundamental clocking frequency as the CLOCK edges close in on the DATA signal edges. Once the CLOCK signal is substantially in phase with the DATA signal, the phase comparator 10 ceases to output the frequency incrementing signal FUP and the output frequency $F_{out}$ is held at a steady state value which is for practical purposes equal to the fundamental clocking frequency of the DATA signal.

For cases where the DATA signal edges lag behind the CLOCK signal edges, the phase comparator 10 outputs the frequency decrementing signal FDN thereby causing the capacitor 30 to discharge to reduce $V_i$ and the output of the VCO (the CLOCK signal) to slow down. This delays the CLOCK signal edges until the edges of the DATA signal catch up to and align with the CLOCK signal. The FDN control signal is shut off once phase alignment is obtained.

The speed at which the PLL system 100 comes into alignment with the incoming DATA signal is referred to as the slew rate. It is desirable to provide the PLL system 100 with as high a slew rate as possible. The slew rate is limited by a characteristic loop gain $G_{LOOP}$ of the PLL system which in turn, is set by the gain functions (transfer functions) of the charge pump 20 and the VCO 40. For most applications, the loop gain $G_{LOOP}$ of the PLL system 100 is kept constant to prevent undesirable loop oscillations. Circuit designers often purposefully provide the charge pump 20 with a constant amplification gain, that is, they hold the magnitude of the pump current $I_p$ at a constant level. Typically, the charge pump 20 is designed as a digital circuit which delivers the pump current $I_p$ in the form of rectangular pulses 21. The magnitude of the input voltage $V_i$ is changed by modulating the pulse width $P_w$ of the pump current pulses 21.

Figure 2:
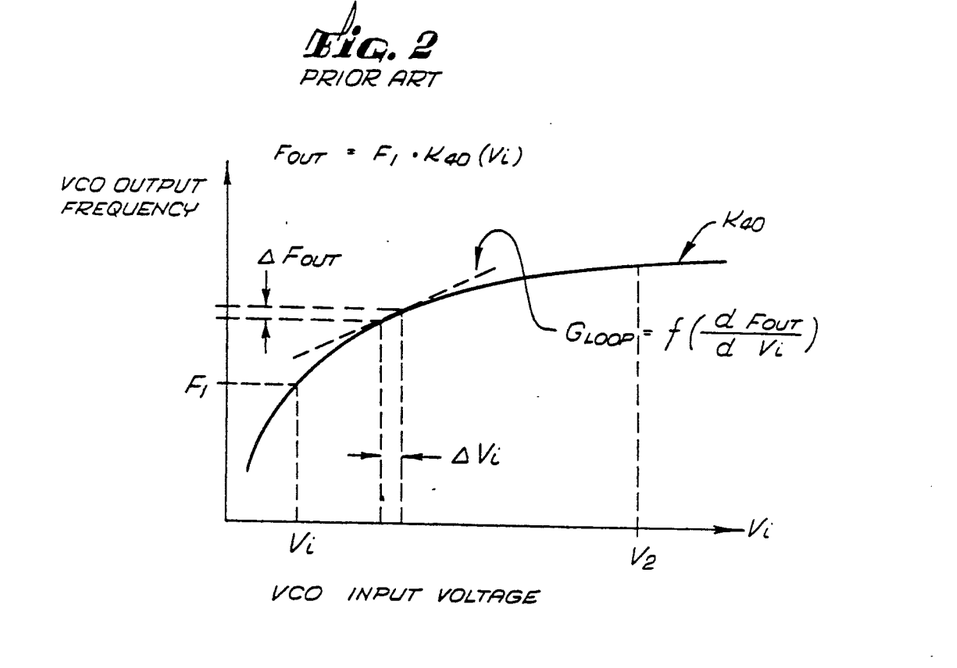
FIG. 2 is a characteristic curve of the gain function of a typical low-cost voltage controlled oscillator.

FIG. 2 illustrates a characteristic curve $K_{40}$ that may be used to describe the gain function of a voltage controlled oscillator such as the VCO 40 used in the circuit of FIG. 1. The gain function defines the relation between the output frequency $F_{out}$ and the input voltage $V_i$. Due to various design constraints, the gain function $K_{40}$ of the VCO 40 is typically non-linear. The gain function $K_{40}$ is often characterized by a rapidly rising first portion beginning at a low end $V_1$ of the VCO's input voltage range and by a second portion which slopes off to a generally flat plateau when the input voltage $V_i$ is increased toward a high end $V_2$ of the input range.

The system loop gain $G_{LOOP}$ is in part a function of how quickly the output frequency $F_{out}$ changes relative to a variable phase difference $\Delta t$ detected by the phase detector (comparator) 10. The phase difference $\Delta t$ is the timing gap between corresponding edges of the CLOCK and DATA signals. A linear rate of frequency change relative to the rate of phase difference change $dF_{out}/d\Delta t$ is often required to keep the loop gain $G_{LOOP}$ constant. Since the voltage $V_i$ across the capacitor 30 rises linearly relative to the phase difference $\Delta t$ ($V_i = I_p \cdot \Delta t / C_i$ where $\Delta t$ is the time of application of the pump current $I_p$), only the slope of the characteristic curve $K_{40}$ is of concern. The loop gain of the PLL system 100 is therefore often defined as:

$$G_{LOOP} = f(dF_{out}/dV_i)$$

The above definition reflects the concern of PLL system designers for the curvature (non/linearity) of the VCO's gain function curve $K_{40}$. Generally it is desirable to force the characteristic curve $K_{40}$ of the VCO to be as linear as possible. This can be done by modifying the design of the VCO to include, for example a pre-compensation circuit (not shown) between the capacitor 30 and VCO 40. The pre-compensation circuit changes the input voltage $V_i$ so as to compensate for the non-linearity of the $K_{40}$ curve. The operating range $\Delta V_i$ and $\Delta F_{out}$ of the PLL system is thereby widened. Such linearization attempts, however, tend to increase the overall cost of the PLL system dramatically because they require additional components that must be matched to the characteristics of the VCO and they introduce new delays into the loop which complicate the design of the PLL system. In other designs, the circuitry of the VCO 40 is kept simple to reduce cost and the PLL system is restricted to operating in a small portion $\Delta V_i$ of the VCO's characteristic curve $K_{40}$. The restriction is imposed by designers in order to maintain a generally constant loop gain $G_{LOOP}$, but the restriction also limits the usefulness of the PLL system to a very small frequency range $\Delta F_{out}$ such as indicated in FIG. 2. The present invention takes a different approach which allows designers to expand the usable $\Delta V_i$ and $\Delta F_{out}$ ranges of servo systems while employing relatively simple, low cost VCO's.

SUMMARY OF THE INVENTION

It is an object of the present invention to provide a charge pump/voltage controlled oscillator combination with a substantially constant transfer function even for situations where the voltage controlled oscillator (VCO) has a non-linear gain function.

The objective is met by increasing the gain of the charge pump when the slope of the VCO gain function decreases.

In accordance with one embodiment of the present invention, a charge-pump/voltage-controlled-oscillator combination is provided wherein a frequency-modulating voltage is applied to the input of a voltage controlled oscillator and the frequency-modulating voltage (or an analog thereof) is also applied to the gain control of a variable-gain charge pump. The variable-gain charge pump feeds a charge integrating filter which supplies the frequency-modulating voltage to the VCO. The characteristic gain function curve of the variable gain charge-pump is arranged to counterbalance the slope of the characteristic gain function curve of the VCO such that a product of the slope of the VCO characteristic curve and the amplitude of the charge pump's characteristic curve will be substantially constant over a predetermined range of frequency-modulating input voltage magnitudes and corresponding output frequencies. A generally linear combined-transfer-function results from the counterbalancing effect of the characteristic curves belonging to the VCO and the charge pump.

It is another object of the present invention to provide a voltage controlled oscillator that is especially suited for use in the above mentioned charge-pump/VCO combination.

This second objective is met by constructing a ring oscillator having a variable delay section which includes one or more inverters that are characterized in that their signal propagation times are a function of a biasing current passing through them. A voltage-to-current conversion means, such as a field-effect-transistor (FET), is used to convert the above described frequency-modulating voltage into a biasing current and the biasing current is passed through the one or more inverters of the variable time delay section to thereby modulate the frequency of the ring oscillator.

It is a third objective of the present invention to provide a CMOS amplifier especially adapted to drive capacitive loads in the above mentioned charge-pump/VCO combination.

This third objective is met by providing a mirror isolated amplifier having an input stage comprising a constant current source, first and second current conduction legs for conducting respective first and second leg currents, and a current splitting means for dividing a constant current generated by the constant current source to produce the first and second leg currents in a balanced manner. Each of the first and second current conduction legs includes an input voltage receiving FET for receiving an input voltage at a gate thereof and for regulating the balance between the first and second leg currents in response to the input voltage. Each of the first and second legs further includes a gate voltage regenerating FET for transforming the leg current of its respective leg into a second gate voltage that is required by the regenerating FET to support the leg current flowing therethrough. The mirror isolated amplifier is further provided with an output stage comprising third and fourth current conduction legs for conducting respective third and fourth leg currents. Each of the third and fourth current conduction legs includes a current mirroring FET whose gate is coupled to the gate of a corresponding gate voltage regenerating FET in the input stage such that the third and fourth leg currents flowing through the output stage will be mirrored copies of the first and second leg currents. The current mirroring FET's are preferably sized larger than the regenerating FET's so that the output stage can conduct larger currents than the input stage. Moreover, the source (or drain) terminals of the current mirroring FET's are preferably each connected directly to a power supply rail so that the output voltage of the mirror isolated amplifier can swing to substantially the full voltage of the power supply rail.

BRIEF DESCRIPTION OF THE DRAWINGS

Like reference numbers are used to denote like elements in the drawings.

DETAILED DESCRIPTION

As discussed above, it is desirable to provide a constant loop gain in servo systems such as the one shown in FIG. 1. A constant loop gain is desired for numerous reasons including for example, the ease with which circuits can be designed to suppress undesirable loop oscillations. The loop gain of the PLL system 100 will be referred to hereafter as $G_{L100}$ to distinguish it from the loop gains of other soon-to-be described systems.

Referring to FIGS. 1 and 2, the loop gain $G_{L100}$ may be expressed as $$G_{L100} = f(dF_{out}/dV_i)$$

where;

$$F_{out} = F_1 \cdot K_{40}(V_i)$$
$$= F_1 \cdot K_{40}(I_p \cdot (t_2 - t_1)/C_i).$$

In the above equations, $K_{40}$ is the gain function of the VCO 40, and $F_1$ is a reference output frequency of the VCO which corresponds to a selected reference input voltage. The reference input voltage can be arbitrarily chosen to be for example $V_i = V_1$ as shown in FIG. 2. The symbols $t_1$ and $t_2$ respectively represent the turn-on and turn-off times of the pump current $I_p$. As mentioned earlier, the magnitude of the pump current $I_p$ is a fixed constant. The direction of the pump current $I_p$ is determined by whether one or the other of the frequency incrementing and decrementing control signals, FUP and FDN, is generated by the phase comparator 10. Since the $K_{40}$ curve of FIG. 2 is non linear, it will become apparent that the loop gain $G_{L100}$ will change with the absolute value of the timing difference, $t_2 - t_1$ and it will be difficult to obtain a servo loop which can operate stably without oscillating over a wide range of DATA signal frequencies and/or phase states.

Figure 3:
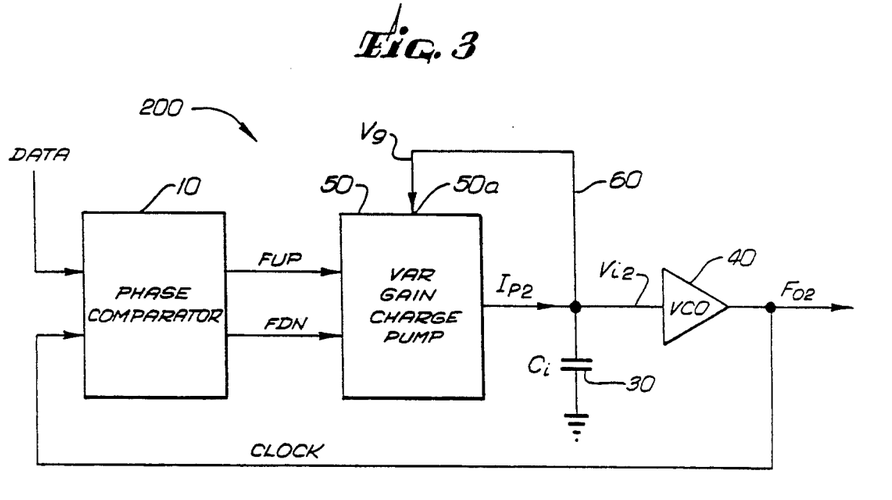
FIG. 3 is a block diagram of a first PLL system in accordance with the present invention.

Referring to FIG. 3, the block diagram of a first PLL system 200 in accordance with the present invention, is shown. The PLL system 200 includes a variable gain charge pump 50 which has an automatic gain control (AGC) input 50a that is responsive to a gain control voltage $V_g$. The magnitude of a variable amplitude output current $I_{P2}$ generated by the variable gain charge pump 50 may be expressed as:

$$I_{P2} = I_1 \cdot K_{50}(V_g).$$

$K_{50}$ is the gain function of the variable gain charge pump 50 and $I_1$ is a predetermined constant corresponding to the current amplitude produced by the charge pump 50 when the gain control voltage $V_g$ is equal to a preselected reference voltage such as $V_g = V_1$ for example.

A voltage linking or coupling element 60 is provided between an input voltage $V_{i2}$ of the VCO 40 and the AGC input 50a of the charge pump 50 so that the control voltage $V_g$ will be a function of the input voltage $V_{i2}$. When the voltage coupling element 60 is simply a wire, such as shown in FIG. 3, it will be apparent that $V_g = V_{i2}$. The output frequency $F_{o2}$ of the PLL system 200 may be expressed as:

$$F_{o2} = F_1 \cdot K_{40}(I_{P2} \cdot (t_2 - t_1)/C_i)$$
$$= F_1 \cdot K_{40}(I_1 \cdot K_{50}(V_{i2}) \cdot (t_2 - t_1)/C_i)$$
$$= F_1 \cdot K_{40}(K_{50}(V_{i2}) \cdot \Delta t \cdot I_1/C_i).$$

Charge accumulated in the capacitor 30 during the time period $\Delta t = t_2 - t_1$ produces the voltages $V_g = V_{i2}$ and in turn, the output frequency $F_{o2}$.

The loop gain may be expressed in accordance with its broader definition as $$G_{L200} = f(dF_{o2}/d\Delta t)$$
$$= f(F_1 \cdot dK_{40}(x)/dy)$$

where, $$x = K_{50}(V_{i2}) \cdot \Delta t \cdot I_1/Ci$$

and $$y = \Delta t.$$

This expression may be rewritten, using calculus, as:

$$G_{L200} = f\left( F_1 \cdot \frac{dK_{40}(x)}{dx} \cdot \frac{dx}{dy} \right)$$
$$= f\left( \frac{dK_{40}(x)}{dx} \cdot K_{50} \right)$$

Figure 4:
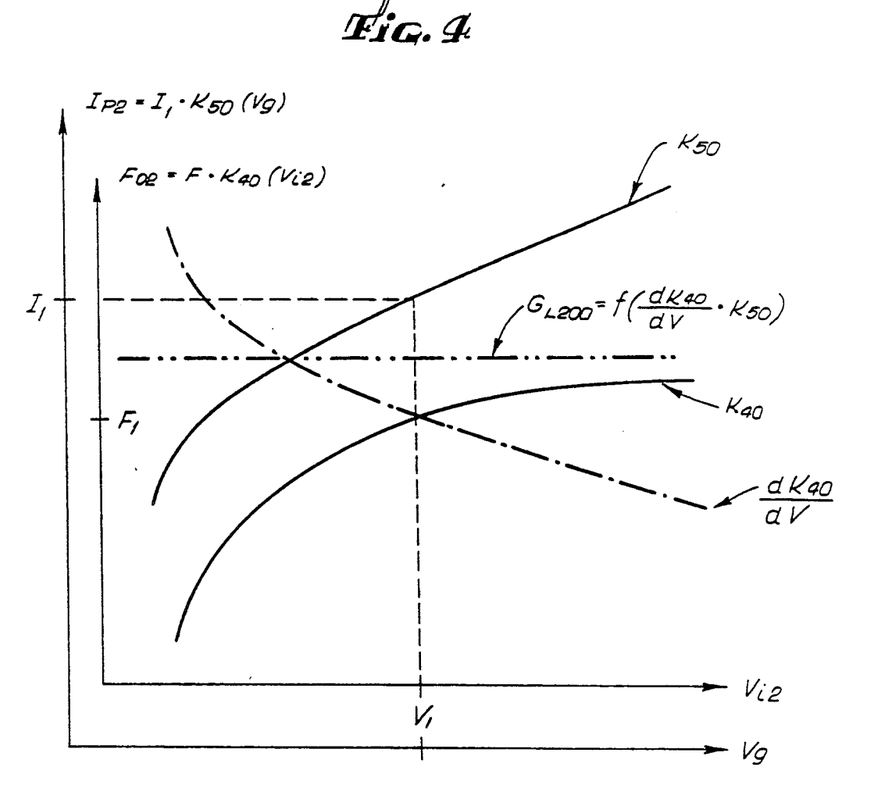
FIG. 4 is a graph illustrating the mirror image relationship between the characteristic curves of a variable gain charge pump and a VCO in accordance with the present invention.

From the above equation, it will be apparent that the loop gain $G_{L200}$ is a function of the product of the slope of the $K_{40}$ curve and the amplitude of the $K_{50}$ curve. If the $K_{50}$ curve is arranged to be generally large in a first voltage range where the curve $K_{40}$ flattens out, and the $K_{50}$ curve is also arranged to be generally small in a second voltage range where the slope of the $K_{40}$ curve is large, then it will be seen by referring to FIG. 4 for example, that the counterbalanced arrangement of the $dK_{40}/dV_{i2}$ and $K_{50}(V_g)$ curves results in a substantially constant loop gain $G_{L200}$. It is to be understood that even when the loop gain $G_{L200}$ is not constant, a substantial improvement in circuit performance can be realized if the product $K_{50}(V_g) \cdot dK_{40}/dV_{i2}$ is made appreciably more linear than the original VCO gain function $K_{40}(V_{i2})$.

Figure 5:
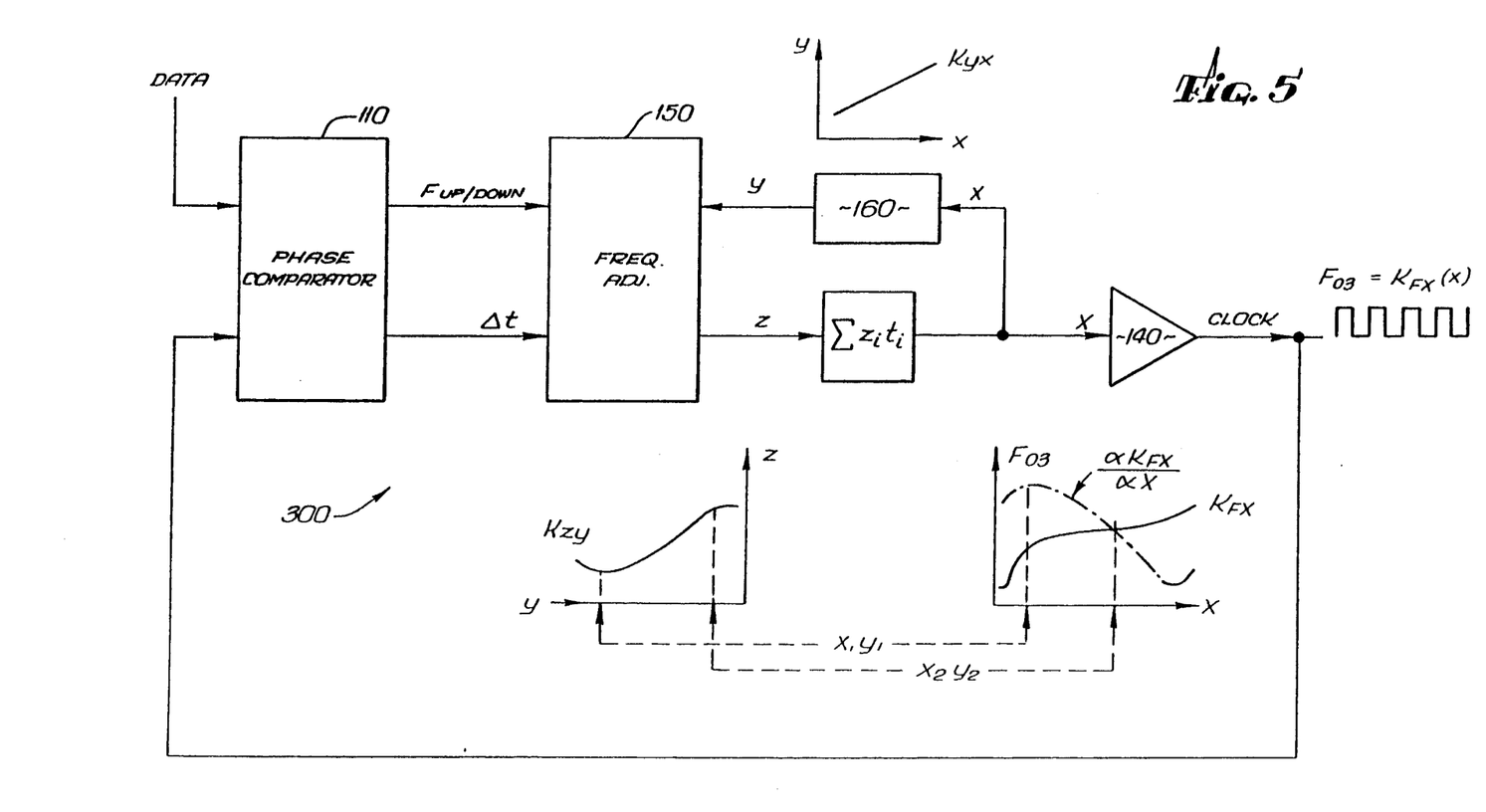
FIG. 5 is a block diagram of a second PLL system.

FIG. 5 is a block diagram of a second PLL system 300 in accordance with the invention. Like reference numbers are used in FIG. 5 to denote like elements conforming to those described for FIG. 4. The second PLL system 300 includes a variable frequency oscillator 140 which produces a periodic CLOCK signal having a variable frequency $F_{o3}$. A first control signal x is supplied to an input of the oscillator 140 to shift the output frequency $F_{o3}$ in accordance with a predetermined gain function $K_{FX}$ such that $F_{o3} = K_{FX}(x)$.

The PLL system 300 has a filter or integrator 130 which receives a second control signal z. The second control signal z is provided as a series of pulses each having an individual magnitude $z_i$ and a respective pulse width $t_i$. The filter 130 processes the pulse series by for example averaging (integrating) the pulses over time to produce the first control signal $x = \Sigma z_i \cdot t_i$. The first control signal x is applied to an input of a mapping or linking means 160 which outputs a third control signal y in response to the first control signal x. The relation betwen the first and third control signals is defined by a mapping or linking function $K_{yx}$ such that $y=K_{yx}(x)$.

A frequency adjuster 150 receives the third control signal y and in response, sets the magnitude $z_i$ of each pulse of the second control signal z in accordance with another characteristic function $K_{zy}$ such that $z_i=K_{zy}(y)$. The individual pulse widths $t_i$ of the second control signal pulses z are set by a phase difference signal $\Delta t$ which is produced by a phase detector 110. The phase detector 110 also supplies an $F_{up/down}$ signal to the frequency adjustor 150 to control the sign of the $z_i$ pulses.

The CLOCK signal from the oscillator 140 is fed back to one input of the phase detector 110 while an externally provided DATA signal, which is to be tracked by the CLOCK signal, is delivered to a second input of the phase detector 110. The loop gain $G_{L300}$ of the PLL system 300 can be expressed as:

$$G_{L300}=f(dF_{o3}/dt_i)$$

where, $$F_{o3}=K_{Fx}(x)=K_{Fx}(K_{zy}(y)\cdot t_i)$$
$$=K_{Fx}(K_{zy}(K_{yx}(x))\cdot t_i).$$

Taking the derivative, one obtains:

$$\frac{dF_{o3}}{dt_i}=\frac{dK_{FX}}{dx}\cdot\frac{dx}{dt_i}$$

where, $x=K_c(x)\cdot t_i$, and, $K_c(x)=K_{zy}(K_{yx}(x))$. The latter term $K_c(x)$ can be thought of as the combined function resulting from the cross-mapping of the respective gain functions $K_{yx}$ and $K_{zy}$. Finally, one can express the loop gain as $$G_{L300}=f(dK_{Fx}/dx\cdot K_c(x)).$$

It will be seen from inspection of the above equations that the loop gain $G_{L300}$ can be kept constant if the product of the slope of the $K_{FX}$ function and the amplitude of the $K_c$ function is kept constant. Referring more specifically to the graphs included in FIG. 5, it will be seen that the linking function $K_{yx}$ maps the $K_{zy}$ function relative to the $K_{Fx}$ function such that for a first cross-mapping point, $x_1, y_1$ where the slope $dK_{Fx}/dx$ is relatively large, the amplitude of the $K_{zy}$ function will be relatively small. Conversely, for a second cross-mapping point, $x_2, y_2$ where the slope $dK_{Fx}/dx$ is relatively small, the $K_{zy}$ function will be relatively large. Thus the counterbalancing effects of the counter arranged $dK_{Fx}/dx$ and $K_{zy}$ curves can be used to create a combined transfer function for the oscillator/frequency-adjustor circuit which is substantially more linear than the gain function $K_{Fx}$ of the oscillator 140 taken alone.

Figure 6:
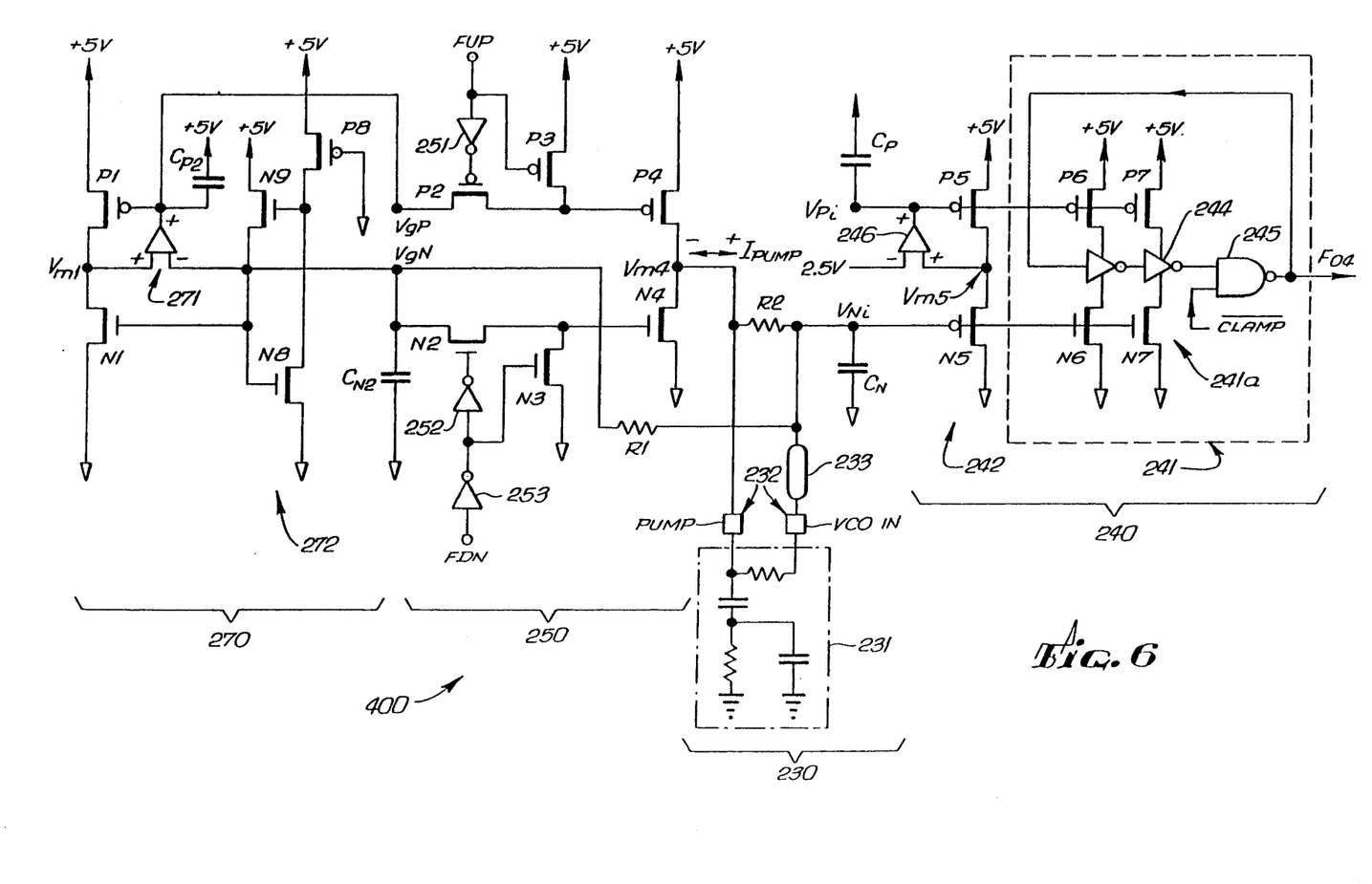
FIG. 6 is a schematic diagram of a third PLL system.

FIG. 6 is a schematic diagram of a PLL subsection 400 which utilizes the above concept. Like reference numerals are used to denote those elements of FIG. 6 which conform to those of FIG. 5. The numerous metal-oxide-semiconductor field-effect-transistors (MOSFET's) shown in FIG. 6 are generally referrenced as either Nx for N-channel devices or as Px for P-channel devices. Those skilled in the art will appreciate that field effect transistors (FET's) and analogous active devices in general exhibit a drain-current/gate-voltage relation similar to the current/voltage curve $K_{50}$ of FIG. 4. It will be shortly seen that this non-linear characteristic of active devices is exploited in the circuit of FIG. 6 to provide a variable gain charge pump having a characteristic gain function similar to $K_{50}$.

A VCO 240 having a transfer function basically similar to that of the $K_{40}$ curve (FIG. 4) is formed by a ring oscillator 241 whose output frequency $F_{o4}$ is a function of a pair of respective first and second biasing input voltages, $V_{Ni}$ and $V_{Pi}$, provided by a bias source generally indicated at 242. The bias source 242 includes an N-channel FET denoted at N5. The gate of N5 is connected to a filter network 230 which includes an on-chip integrating capacitor $C_N$ and an external filter 231. All circuit components shown in FIG. 6, except for the external filter 231, are provided on the substrate of a single integrated circuit (IC) chip. Connections to off-chip circuitry is provided through a plurality of chip connection pads 232. An electrostatic discharge pad 233 is connected to the gate of N5 to protect that MOSFET from dangerous high voltages which may be generated outside the IC chip.

The gate of N5 is also connected to the gates of N-channel FET's N6 and N7 which form portions of two vertical current biasing legs, P6-N6 and P7-N7, that supply biasing currents to a pair of respective CMOS inverters 243 and 244 in the ring oscillator 241. The signal propagation times of the inverters 243 and 244 vary in accordance with the magnitude of bias currents provided through their respective biasing legs. This aspect of the circuit will be described in greater detail when a variable delay section 241a of the ring oscillator 241 (shown in FIG. 7) is later discussed. The variable delays of the inverters 243, 244 established the output frequency $F_{o4}$ of the ring oscillator 241. P-channel FET's P6 and P7 are provided in complementary relation to the FET's N6 and N7 in the current biasing legs P6-N6 and P7-N7. The gates of P6 and P7 are connected to the gate of another P-channel FET P5 which is included in the bias source 242.

A NAND gate 245 couples the output of the inverter 244 to the input of the other inverter 243 in the ring oscillator 241. A $\overline{CLAMP}$ signal is applied to the NAND gate 245 to start and stop the oscillation of the ring oscillator 241 at desired times. The ring oscillator inverters, 243 and 244, are CMOS circuits (FIG. 7) which operate on average at voltages midway between the +5 V and ground rails of the illustrated PLL system 400. A first differential amplifier 246 drives the gate of P5 to produce the second input voltage $V_{Pi}$ in a manner which balances the midleg voltage of the P5-N5 leg at approximately 2.5 V so that the P5-N5 leg will be generally speaking a DC mirror image of the P6-N6 and P7-N7 legs in the ring oscillator 241. A capacitor $C_N$ is connected to the output of the first differential amplifier 246 to stabilize the second biasing input voltage $V_{Pi}$. As a result of mirror image symmetry, it will be appreciated that the biasing currents flowing through the P6-N6 and P7-N7 legs of the ring oscillator will be approximately the same as the current flowing through the P5-N5 leg of the bias source 242.

When the first input voltage $V_{Ni}$ at the gate of N5 rises, more current will flow through the P5-N5 leg, and as a consequence of current mirroring, the bias currents in the P6-N6 and P7-N7 legs will increase to thereby increment the output frequency $F_{o4}$ of the ring oscillator 241 upwardly. Conversely, when the first input voltage $V_{Ni}$ at the gate of N5 is decreased, the output frequency $F_{o4}$ is decremented. The first input voltage $V_{Ni}$ can as a result be referred to as a frequency-modulating voltage that shifts the output frequency of the VCO 240.

The first input voltage $V_{Ni}$ is generated by time averaging (integrating) a pump current $I_{PUMP}$ which is supplied to the filter 230 either in a forward direction (source current) from a first pump circuit FET, P4, or in a backward direction (sink current) from a complementary, second pump circuit FET N4. A first FET switch comprising an inverter 251 and a pair of transistors, P2 and P3, connects or disconnects the gate of the first pump circuit FET P4 to a p-side gate biasing voltage $V_{gP}$ in response to a frequency incrementing control signal FUP. A second FET switch comprising inverters 252, 253 and a pair of transistors, N2 and N3, connects or disconnects the gate of the second pump circuit FET N4 to an n-side gate biasing voltage $V_{gN}$ in response to a frequency decrementing control signal FDN.

When the FUP control signal is applied to the first FET switch, the p-side biasing voltage $V_{gP}$ is supplied to the gate of P4. A forward pump current $+I_{PUMP}$ having a magnitude that is a function of the p-side biasing voltage $V_{gP}$ can consequently be sourced to the filter network 230 for accumulating charge therein. If on the other hand, the FDN control signal is activated, the n-side gate biasing voltage $V_{gN}$ will be applied to the gate of N4 through the second FET switch. A backward (sinking) current $-I_{PUMP}$ having a magnitude that is determined by $V_{gN}$ will flow through N4 out of the filter network 230.

Of importance, a linking resistor 260 ($R_1$) is provided to connect the gate of N5 to the second FET switch so that $V_{gN}$ will be equal to $V_{Ni}$ when the FDN control signal is activated for a predetermined time period $\Delta t$. The magnitude of the backward current $-I_{PUMP}$ will as a result, become a function of the magnitude of the first biasing input voltage $V_{Ni}$ at the gate of N5.

An n-side/p-side conversion circuit 270 is provided between the first and second FET switches (P2 and N2) to transform the n-side gate biasing voltage $V_{gN}$ to its complementary p-side biasing voltage $V_{gP}$. The conversion circuit 270 forces the p-side gate biasing voltage $V_{gP}$ to be a function of $V_{gN}$ and from there, to be a function of the (frequency-modulating) first input voltage $V_{Ni}$.

In the conversion circuit 270, the n-side biasing voltage $V_{gN}$ is applied to the gate of a current mirroring N-channel FET N1. This FET N1 is arranged in mirror image relation to the second pump circuit FET N4 so that a hypothetical leg current that could flow through the P4-N4 leg of the charge pump 250 will be mirrored into a P1-N1 leg of the conversion circuit 270 that includes the mirroring FET N1. The current flowing through N1 must also flow through a P-channel second mirroring FET P1 that included in the P1-N1 leg. A second differential amplifier 271 drives the gate of P1 to generate the p-side biasing voltage $V_{gP}$. A negative input of the second amplifier 271 is connected to the n-side biasing voltage $V_{gN}$ such that the p-side gate voltage $V_{gP}$ will change in inverse relation to any change of its complementary n-side biasing voltage $V_{gN}$. A positive input of the second amplifier 271 is connected to the drain of P1. Under steady state conditions, the second amplifier 271 urges the P1-N1 midleg voltage $V_{ml}$ (at the drains of P1 and N1) equal to the n-side biasing voltage $V_{gN}$. This is done so that the currents through P1/N1, and hence through P4/N4, will be as equal as possible despite the modulation of a midleg voltage $V_{m4}$ at the drains of transistors P4 and N4. It should be noted that the n-side gate biasing voltage $V_{gN}$ is DC-wise a substantial equivalent of the P4-N4 midleg voltage $V_{m4}$ because $V_{m4}$ is coupled to the node of $V_{gN}$ by a low pass filter comprising resistors $R_2$, $R_1$, and capacitors $C_N$, $C_{N2}$. The drain-source voltages of P1 and N1 will therefore mimic the drain-source voltages of corresponding transistors P4 and N4. $V_{m1}$ is urged to be a DC-wise substantial equivalent of $V_{m4}$ by the action of the second amplifier 271. The P1-N1 leg thereby becomes a steady-state mirror image of the P4-N4 leg and furthermore, in the case when $V_{m4}$ settles down to equal $V_{cc}/2 = 2.5$ V, a steady-state mirror image of the P5-N5 leg in the VCO 240. The steady state midleg voltage $V_{m5}$ of the P5-N5 leg it should be noted, is forced to a steady state 2.5 V (equal to $V_{gN}$ in the steady state) by the first differential amplifier 246.

A pair of capacitors, $C_{N2}$ and $C_{P2}$, are connected to respective lines of the n-side and p-side biasing voltages, $V_{gN}$ and $V_{gP}$, to prevent undesirable oscillations in those biasing voltages. A voltage limiting circuit 272 comprising N-channel FET's, N8, N9 and P-channel FET P8 is connected to the n-side biasing voltage line ($V_{gN}$) to prevent that line from dropping completely to ground. If $V_{gN}$ is allowed to go to zero, a lock-up state results wherein neither of the charge pump FET's, P4 and N4, can be activated to alter the filter network's output voltage $V_{Ni}$. In the lock-up state, $V_{gP}$ rises to the +5 V level of P4's source and $V_{gN}$ drops to the same ground level existing at the source of N4 so that both transistors are turned off. The FUP and FDN control signals cannot be used to to bring the system 400 out of this state.

The gate of N8 senses the voltage on the n-side biasing voltage line ($V_{gN}$). If $V_{gN}$ drops toward zero, N8 shuts off and its drain voltage rises towards +5 V. Since the gate of N9 is connected to N8's drain, N9 is turned on under this situation and N9 forces $V_{gN}$ back up towards the +5 V rail. P8 supplies a bias current to N8.

Figure 7:
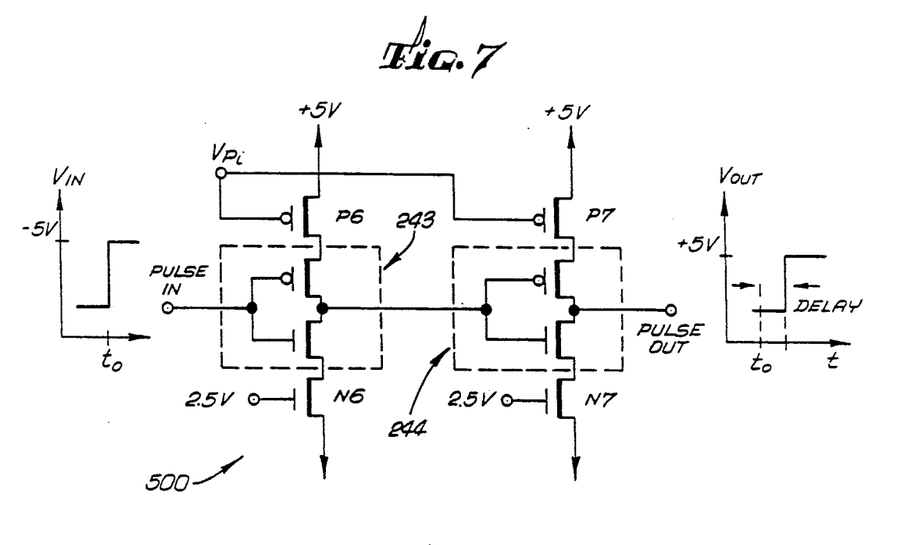
FIG. 7 is a schematic diagram of a variable time delay section such as used in the circuit of FIG. 6.
Figure 8:
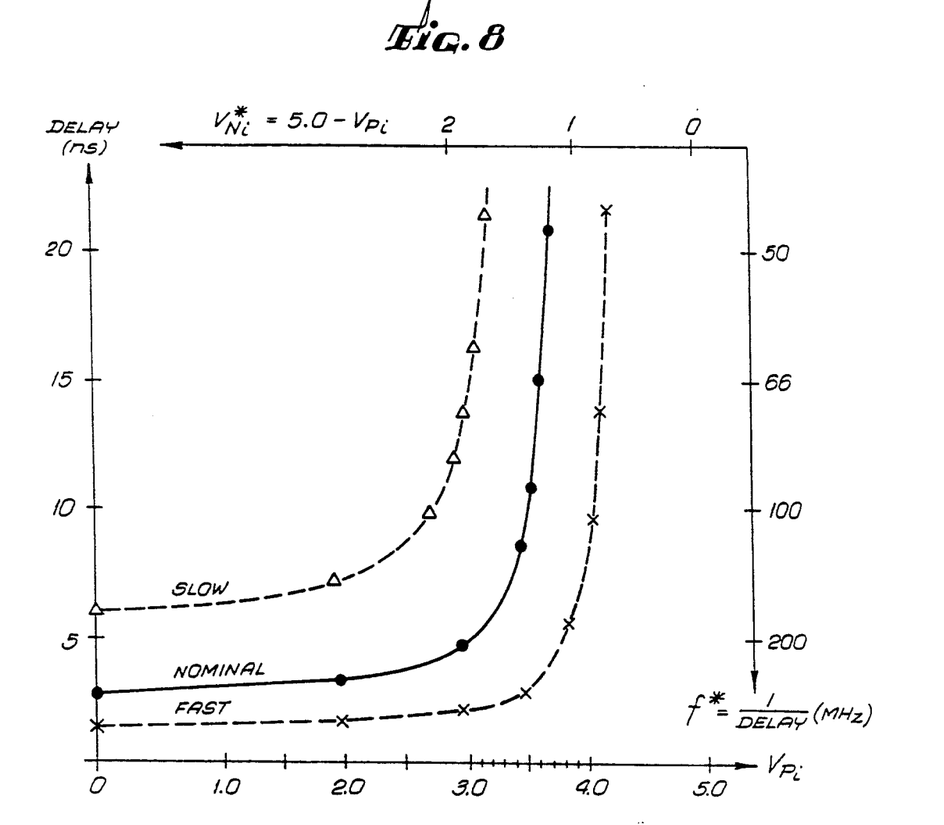
FIG. 8 is a graph illustrating the characteristic signal propagation delays of a plurality of variable time delay sections such as shown in FIG. 7 that are fabricated as integrated circuits and are obtained from different wafer processing batches.

Referring now to FIGS. 7 and 8, the variable delay section 241a of the ring oscillator 241 will be explained by describing the characteristics of a test circuit 500 shown in FIG. 7. The test circuit 500 has the same configuration as the variable delay section 241a and like reference symbols are used to denote like elements.

The voltages at the gates of N6 and N7 were held constant while the voltage $V_{Pi}$ at the gates of P6 and P7 was stepped upwardly from zero toward +5 V. At each step of the $V_{Pi}$ voltage range, measurements were made of the signal propagation delay through a series connected chain comprising the CMOS inverters 243 and 244. A fast rising pulse $V_{in}$ was applied at a first time instance $t_0$ to the input of the first inverter 243 in the series connected chain and the delay time for the rising edge of the input pulse to be delivered as an output $V_{out}$ at the output of the second inverter 244 was recorded.

The test circuit 500 was reproduced on a number of integrated circuits, each being manufactured under slightly different wafer production conditions. A Gaussian-like distribution was observed in the signal delay characteristics of the numerous reproduced circuits. The mean delay characterisitic is illustrated in FIG. 8 as the nominal delay curve. For yet undetermined reasons, some circuits were relatively fast such as indicated by the lowest curve in FIG. 8 and other circuits were relatively slow as indicated by the upper most curve. All of the delay curves however were generally of the same asymptotic shape. It can be seen from the test results that as $V_{Pi}$ was stepped toward +5 V the signal propagation time (DELAY) changed slowly at first and then rose asymptotically at a faster rate as the range 3.0–4.0 V was reached. The increasing $V_{Pi}$ voltage can be correlated with a decreasing biasing current in the legs P6-N6 and P7-N7. Similar results are predicted for a modified experiment wherein $V_{Pi}$ is held constant and the voltage at the gates of N6 and N7 is stepped in a reverse direction from +5 V towards zero. A theoretical $V^*_{Ni}$ scale is shown in FIG. 8 to illustrate the expected results. A normalized frequency scale $f^* = 1/\text{DELAY}$ (MHz) is also drawn in FIG. 8 to show how the frequency of a ring oscillator incorporating the variable time delay circuit 500 is expected to behave.

When the $f^*/V^*_{Ni}$ scales of FIG. 8 are considered, it will be noted that the normallized frequency $f^*$ changes rapidly at the low end of the theorized $V^*_{Ni}$ scale and that the rate of frequency change drops off as $V^*_{Ni}$ rises. This corresponds to the $K_{40}$ curve (FIG. 4) that is associated with previously known voltage controlled oscillators (VCO's). The variable time delay circuit 500 of FIG. 7 is preferred for the PLL subsection 400 (FIG. 6) because the component FET's of the vertical legs P6-N6 and P7-N7 can be easily fabricated on a common semiconductive substrate to be matched with the p-channel and n-channel FET's of the vertical circuit legs, P1-N1, P4-N4 and P5-N5, using CMOS manufacturing technology. The frequency characteristics of the variable delay section 241a tend to be matched to the current producing capabilities of the P4-N4 vertical leg when both circuits are fabricated on the same IC chip under identical wafer production conditions. Since the ring oscillator 241 is relatively simple, the VCO 240 of FIG. 6 can be designed to occupy a very small portion of the available surface area on a standard size IC chip thereby making room for additionally desired features which can be incorporated into the same IC chip.

Figure 9A:
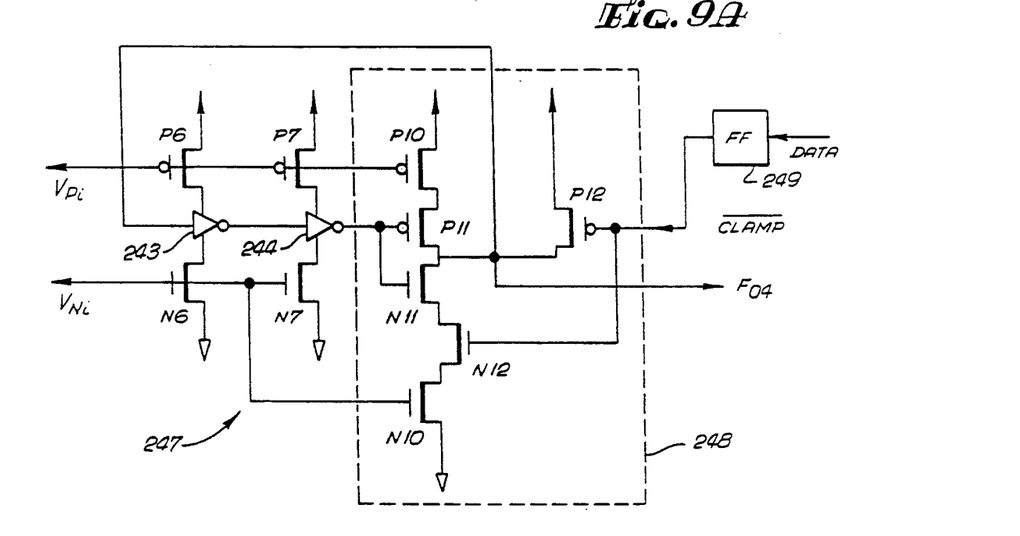
FIGS. 9A and 9B are schematic diagrams of two ring oscillators according to the present invention.

A first modified ring oscillator 247 in accordance with the present invention is shown in FIG. 9A. The modified ring oscillator 247 may be substituted for the ring oscillator 241 of FIG. 6. Like reference symbols denote like elements in FIGS. 6 and 9A. The NAND gate 245 of FIG. 6 is replaced by a variable delay NAND gate 248. The variable delay NAND gate 248 includes a complementary pair of current biasing transistors, P10 and N10, whose gates are correspondingly connected to the gates of P6, P7 and N6, N7. Transistors P11, N11 and N12 are included in a vertical P10-N10 leg of the NAND gate 248 along with P10 and N10. P12 is connected between the +5 V rail and the middle of the P10-N10 leg. When the $\overline{\text{CLAMP}}$ signal, which is applied to the gates of P12 and N12, is raised to a logic high (+5 V), N12 is turned on and P12 is turned off. The ring oscillator 247 starts up in a predeterminable phase state relative to the time of the switching of the $\overline{\text{CLAMP}}$ signal to its logic high level. If the $\overline{\text{CLAMP}}$ signal is generated by a flip flop 249 that in turn is triggered by a suitable edge of the DATA signal, the ring oscillator 247 may be started up approximately in phase with the edges of the DATA signal. Thus the duration of the phase locking mode can be minimized. The $\overline{\text{CLAMP}}$ control level can also be used to shut off the ring oscillator 247 at a desired time.

Figure 9B:
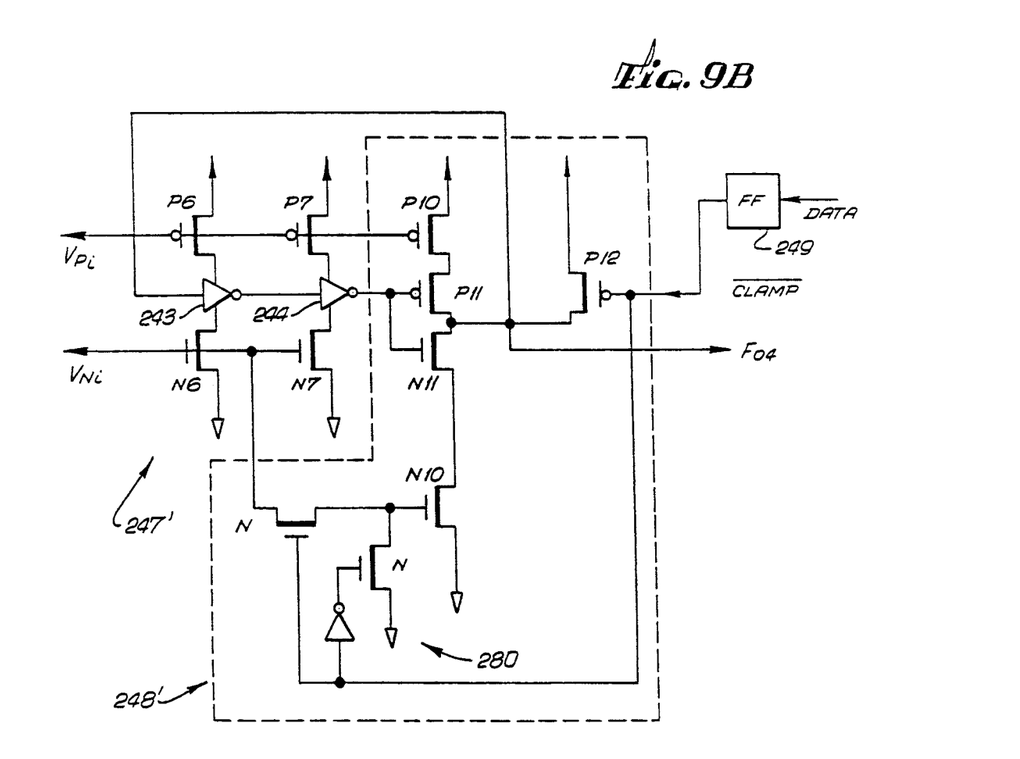

A second modified ring oscillator 247' is shown in FIG. 9B. Like reference symbols denote like elements in FIGS. 9A and 9B. A high speed NAND gate 248' is formed by replacing the serially connected transistor N12 of FIG. 9A with an FET switch 280 which drives the gate of N10 in response to the $\overline{\text{CLAMP}}$ signal. It has been found that the high speed NAND gate 248' of FIG. 9B has a shorter delay time than the NAND gate 248 of FIG. 9A and thus, the second modified ring oscillator 247' can attain higher operating frequencies.

Referring to FIG. 6, it will be observed that the outputs of the first and second differential amplifiers, 246 and 271, are connected to drive respective capacitive loads, $C_P$ and $C_{P2}$. Capacitive loads require unusually large currents when rapid level shifting is desired. Conventional CMOS differential amplifiers lack this capability.

Figure 10:
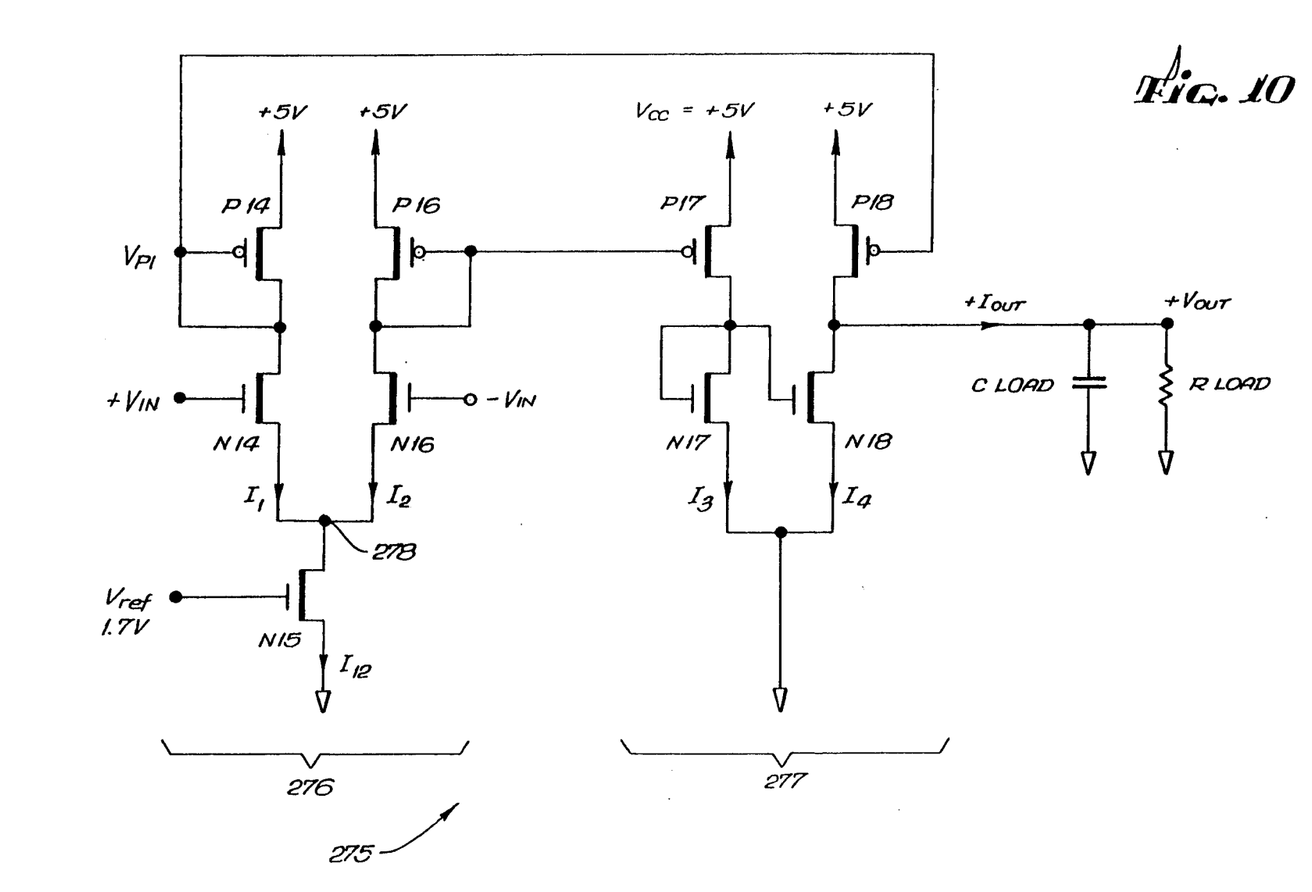
FIG. 10 is a schematic diagram of a mirror isolated amplifier according to the present invention.

FIG. 10 is a schematic diagram of a preferred amplifier circuit 275 which is used for the differential amplifiers, 246 and 271. For reasons soon to be apparent, the amplifier circuit 275 is referred to as a mirror isolated amplifier. The mirror isolated amplifier 275 has an input stage comprising first and second vertical current legs, P14-N14 and P16-N16. A matched output stage 277 of the amplifier 275 is provided with a corresponding set of third and fourth vertical current legs, P17-N17 and P18-N18. First and second vertical currents, $I_1$ and $I_2$, of the respective first and second vertical legs are joined at a current summing node 278 whose combined output, $I_{12}$, is passed through a constant current source N15. For various reasons including size limitations placed on N15, it is preferred that the combined current $I_{12}$ is kept relatively small. The gate of N15 is connected to a 1.7 V reference voltage.

The gates of N14 and N16 respectively receive the positive and negative input voltages, $+V_{IN}$ and $-V_{IN}$, of the amplifier 275. Since the summed current $I_{12} = I_1 + I_2$ is substantially constant, any change in the first vertical current $I_1$ will be balanced by an opposed or competing change in the second vertical current $I_2$. Accordingly, if the positive input voltage $+V_{IN}$ rises above the negative input voltage $-V_{IN}$, the first vertical current $I_1$ will increase and the second vertical current $I_2$ will decrease.

The first and second vertical currents, $I_1$ and $I_2$, pass respectively through a pair of gate voltage regenerating transistors, P14 and P16, provided in the upper portions of the first and second vertical legs. The gates of P14 and P16 are connected to their respective drains so as to generate the necessary gate voltages, $V_{P1}$ and $V_{P2}$, for conducting the corresponding first and second vertical currents, $I_1$ and $I_2$.

The generated gate voltages, $V_{P1}$ and $V_{P2}$, are coupled to the gates of corresponding p-channel mirroring FET's, P18 and P17, in the output stage 277. The P-channel mirroring FET's, P18 and P17, are preferably enlarged copies (e.g. having wider channel regions) of the respective input stage p-channel regenerating FET's, P14 and P16 such that substantially larger currents will flow through P17 and P18 for a given gate voltage.

The third and fourth vertical currents, $I_3$ and $I_4$, flowing through P17 and P18 respectively are magnified reproductions of the first and second vertical currents, $I_1$ and $I_2$, due to current mirroring. The enlarged third and fourth vertical currents, $I_3$ and $I_4$, pass through respective n-channel FET's, N17 and N18, of the third and fourth vertical legs in the output stage 277. The drain of N17 is connected to its gate and also to the gate of N18 so that a current decrease through N17 will generally result in a lower gate voltage at N18 and consequently a higher voltage drop across the drain and source of N18. An output voltage signal +$V_{OUT}$ is generated at the drain of N18.

N17 and N18 are enlarged copies of N14 and N16, respectively. The output stage vertical legs, P17-N17 and P18-N18, are therefore enlarged mirror reproductions of the input stage vertical legs, P16-N16 and P14-N14. Because the components of the output stage 277 are upwardly scaled reproductions of the devices in the input stage 276 (with the exception of the current limiting transistor N15), a relatively large output current $I_{OUT}$ can be delivered from the fourth vertical leg P18-N18 to an amplifier load. Because the source terminals of P18 and N18 are respectively connected directly to the +5 V and ground power rails, the output voltage $V_{OUT}$ can swing across substantially the full voltage between the power supply rails. The capacity of the amplifier to supply a relatively large output current $I_{OUT}$ means that the amplifier load can include a relatively large capacitive component $C_{LOAD}$ and/or a relatively small resistive component $R_{LOAD}$ while the amplifier can still supply a desired output voltage signal +$V_{OUT}$. The vertical currents, $I_1$ and $I_2$, of the input stage 276 are isolated from the output current $I_{OUT}$ such that loading effects at the output stage 277 will generally not alter the constant level balance $I_{12}=I_1+I_2$ in the input stage. The mirror isolated amplifier 275 can accordingly provide the necessary output power for driving the capacitive loads, $C_P$ and $C_{P2}$, of the differential amplifiers 246, 271 in the circuit of FIG. 6. Furthermore, when the positive and negative input voltages are equal, +$V_{IN}=-V_{IN}$, and the amplifier load is substantially capacitive ($C_{LOAD}$ is large relative to any discharging resistance $R_{LOAD}$), the output voltage $V_{OUT}$ at the drain of N18 can be held at a desired level (e.g. $V_{cc}/2=2.5$ V) because the drain current $I_4$ of N18 matches the drain current of the complementary transistor P18 and $I_{OUT}$ is therefore substantially equal to zero. This eliminates the need for a voltage offset circuit normally used in amplifiers to force the output to settle at a desired voltage level such as $V_{cc}/2$.

It will of course be understood that numerous modifications to the present invention, in its various aspects, will be apparent to those skilled in the art, some being apparent only after study and others being matters of routine electronic design and device fabrication. As such, the scope of the invention should not be limited by the particular embodiments described herein but should rather be defined by the appended claims and equivalents thereof.

We claim:

1. A phase locked loop circuit for receiving a first periodic signal and phase locking it with a second periodic signal, comprising:

a phase comparator for receiving the first and second periodic signals and providing a phase difference signal corresponding to the amount which the phase of the first periodic signal leads or lags the phase of the second periodic signal including a means for supplying the time/duration control signal to the charge pump, wherein the time/duration control signal is generated in response to the comparison of the first periodic signal and the second periodic signal;

a voltage controlled oscillator (VCO) having an input for receiving a control voltage thereat and an output for producing a variable frequency output signal in response to the control voltage and providing said output to said phase comparator as said second periodic signal;

a variable gain charge pump having an input for receiving said phase difference signal, a pump current output for producing a pump current of variable magnitude, a gain control input for controlling the magnitude of the pump current and a time/direction control means for receiving a time/direction control signal and for controlling the duration and direction of the pump current in response to the time/direction control signal;

a charge accumulating means, coupled between the pump current output of the charge pump and the input of the VCO, for accumulating charge supplied by the pump current to thereby produce the control voltage which is applied to the input of the VCO; and linking means, coupled between the input of the VCO and the gain control input of the charge pump, for causing the variable magnitude of the pump current to be a function of the VCO control voltage.

2. A phase locked loop circuit for receiving a first periodic signal and phase locking it with a second periodic signal, comprising:

a phase comparator for receiving the first and second periodic signals and providing a phase difference signal corresponding to the amount which the phase of the first periodic signal leads or lags the phase of the second periodic signal a voltage controlled oscillator (VCO) having an input for receiving a control voltage thereat and an output for producing a variable frequency output signal in response to the control voltage and providing said output to said phase comparator as said second periodic signal, and having a first characteristic curve relating the output frequency of the VCO to the control voltage of the VCO, which curve includes a first portion having a relatively large slope and a second portion having a relatively small slope;

a variable gain charge pump having an input for receiving said phase difference signal, a pump current output for producing a pump current of variable magnitude, a gain control input for controlling the magnitude of the pump current and a second characteristic curve relating the magnitude of the pump current to the amplitude of the gain control signal supplied by the linking means, which curve includes a first range wherein the magnitude of the pump current is relatively small and a second range wherein the magnitude of the pump current is relatively large;

a charge accumulating means, coupled between the pump current output of the charge pump and the input of the VCO, for accumulating charge supplied by the pump current to thereby produce the control voltage which is applied to the input of the VCO; and linking means, coupled between the input of the VCO and the gain control input of the charge pump, for causing the variable magnitude of the pump current to be a function of the VCO control voltage including means for mapping the first portion of the first characteristic curve to the first range of the second characteristic curve and the second portion of the first characteristic curve to the second range of the second characteristic curve such that the magnitude of the pump current will be relatively small when the slope of the first characteristic curve is relatively large and the magnitude of the pump current will be relatively large when the slope of the first characteristic curve is relatively small.

3. A phase locked loop circuit, for receiving first and second signals and locking the signals in phase, comprising:

a phase comparator for receiving the first and second signals and providing a frequency up signal if the second signal lags the first signal and a frequency down signal if the signal leads the first signal;

means, coupled to the comparator so as to receive the frequency up and frequency down signals and having a variable gain control input for receiving a gain control signal, for providing a frequency control signal having a magnitude determined by the gain control signal, and comprising:

a charge pump for providing an output current, the charge pump having a first nonlinear gain function; and means for receiving said output current and providing a control voltage proportional to the accumulated charge as said frequency control signal;

a voltage controlled oscillator, having an input coupled to said means for providing a frequency control signal, and having a second nonlinear gain function, for receiving said frequency control signal and providing a variable frequency output signal as said second signal; and means, coupled to said variable frequency oscillator input for providing said gain control signal to said means for providing a frequency control signal;

wherein the first nonlinear gain function substantially offsets the slope of the second nonlinear gain function.

* * * * *